(12) United States Patent
Vassiliadis et al.

(10) Patent No.: US 6,980,138 B2
(45) Date of Patent: Dec. 27, 2005

(54) METHOD AND A SYSTEM FOR VARIABLE-LENGTH DECODING, AND A DEVICE FOR THE LOCALIZATION OF CODEWORDS

(75) Inventors: Stamatis Vassiliadis, Pijnacker (NL); Jari Nikara, Tampere (FI); Jarmo Takala, Tampere (FI); Petri Liuha, Tampere (FI)

(73) Assignee: Nokia Corporation, Espoo (FI)

( * ) Notice: Subject to any disclaimer, the term of this patent is extended or adjusted under 35 U.S.C. 154(b) by 161 days.

(21) Appl. No.: 10/465,033

(22) Filed: Jun. 18, 2003

(65) Prior Publication Data

US 2004/0070525 A1 Apr. 15, 2004

(30) Foreign Application Priority Data

Jun. 20, 2002 (FI) .............................. 20021221

(51) Int. Cl.[7] .............................................. H03M 7/40
(52) U.S. Cl. .............................. 341/67; 341/59; 341/63
(58) Field of Search .............................. 341/67, 59, 63, 341/65

(56) References Cited

U.S. PATENT DOCUMENTS

| 5,245,338 A | 9/1993 | Sun |
| 5,280,349 A | 1/1994 | Wang et al. |
| 5,394,144 A | 2/1995 | Kim |
| 5,488,366 A | 1/1996 | Wu |
| 5,491,480 A | 2/1996 | Jan et al. |
| 5,648,775 A | 7/1997 | Kim |
| 5,835,035 A | 11/1998 | Bakhmutsky |
| 5,929,793 A | 7/1999 | Choi |
| 5,963,154 A * | 10/1999 | Wise et al. .................... 341/67 |
| 6,411,229 B2 * | 6/2002 | Kobayashi .................... 341/67 |
| 6,542,095 B1 * | 4/2003 | Chen et al. .................... 341/67 |
| 6,573,846 B1 * | 6/2003 | Trivedi et al. ................. 341/67 |

FOREIGN PATENT DOCUMENTS

EP 0663730 7/1995

OTHER PUBLICATIONS

Mikael Karisson Rudberg and Lars Wanhammar, "*High Speed Pipelined Parallel Huffman Decoding,*" Circuits and Systems, 1997, IEEE Proceedings, 1997 International Symposium, Jun. 9–12, 1997.

Cheng–Teh Hsieh and Seung P. Kim, "*A Concurrent Memory–Efficient VLC Decoder for MPEG Applications,*" IEEE Transactions Consumer Electronics, vol. 42, No. 3, Aug. 1996, pp. 439–446.

* cited by examiner

Primary Examiner—Michael Tokar
Assistant Examiner—Lam T. Mai
(74) Attorney, Agent, or Firm—Alfred A. Fressola; Ware, Fressola, Van Der Sluys & Adolphson LLP

(57) ABSTRACT

A method and associated decoder, system, device and storage means for decoding codewords of variable length from a bit stream, in which minimum and maximum lengths are defined for the codewords, wherein the bit stream is processed in parts, each part being subjected to a search for codewords, and where found codewords are decoded. At least partly overlapping fields are extracted from the bit stream part in such a way that the starting point of at least two fields is a possible starting point of a codeword in that part. In at least one field, the end of the codeword is searched, and the data related to the codeword is determined on the basis of the end point of the codeword. Data relating to at least one codeword is used to determine the occurrence of the codeword intended to be decoded in a field, and the found codeword is decoded.

14 Claims, 5 Drawing Sheets

| Symbol | H(x) | P(x) | Code |
|--------|------|------|------|
| a | 1.32 | 0.4 | 0 |
| b | 1.74 | 0.3 | 10 |
| c | 2.32 | 0.2 | 111 |
| d | 3.32 | 0.1 | 110 |

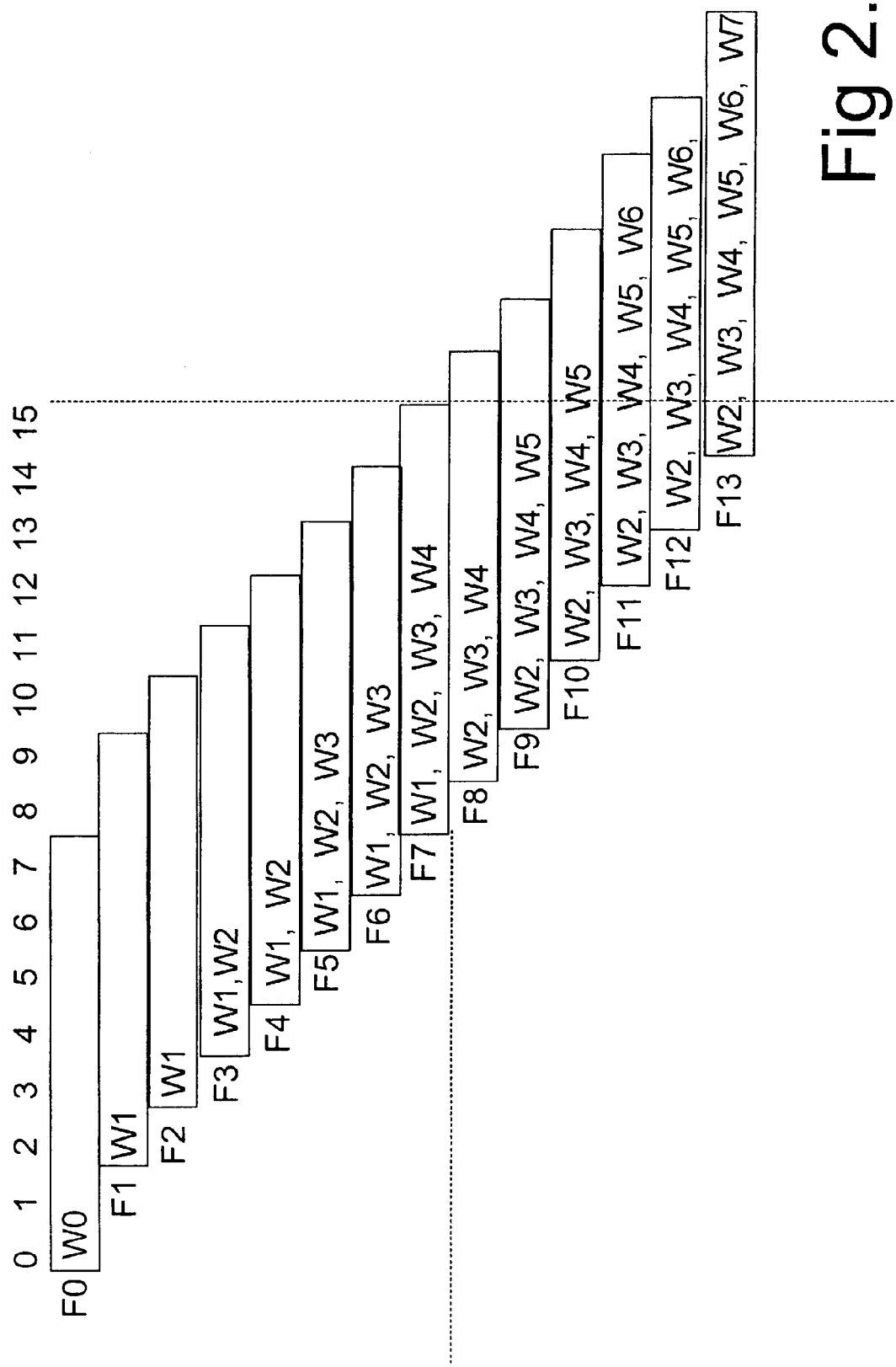

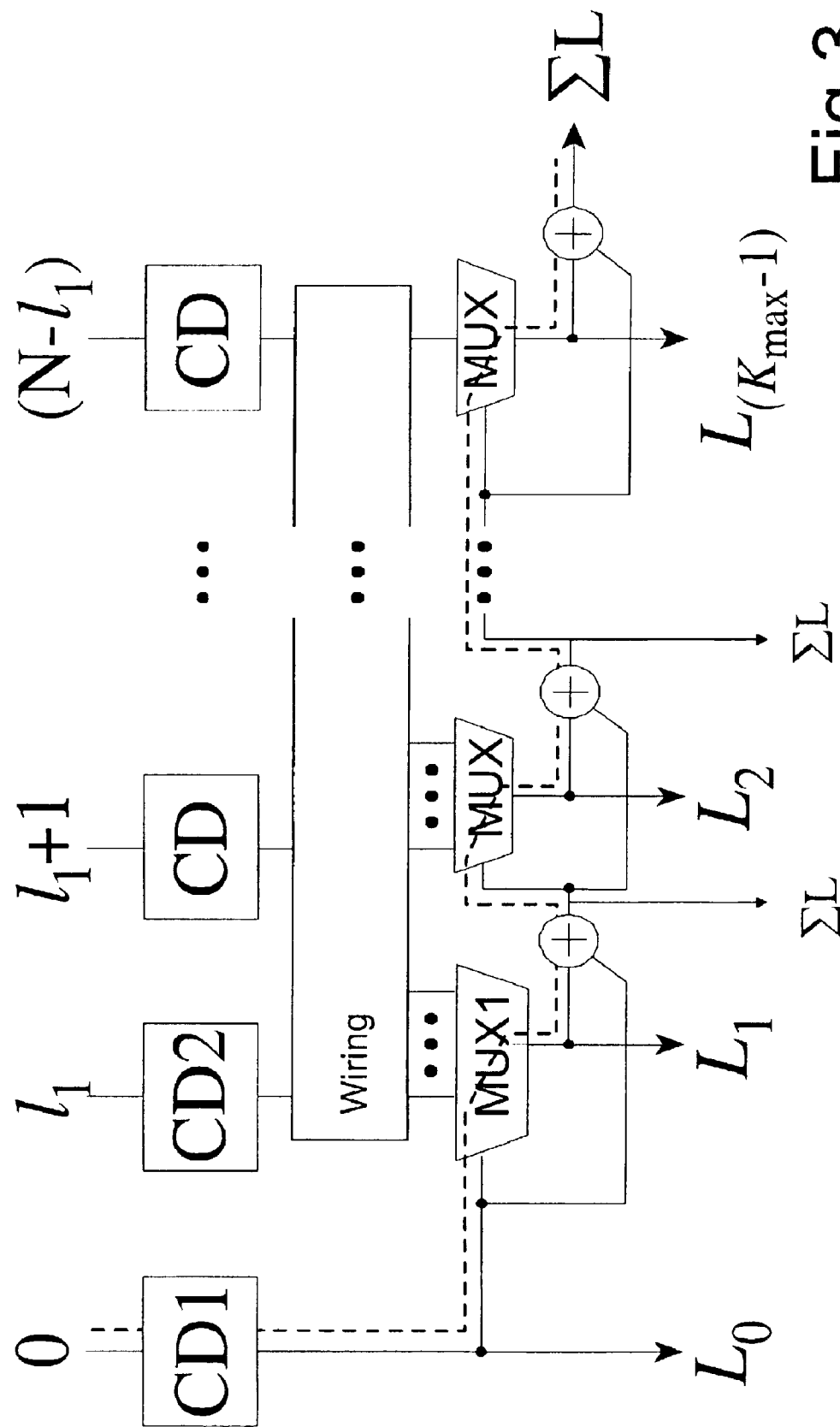

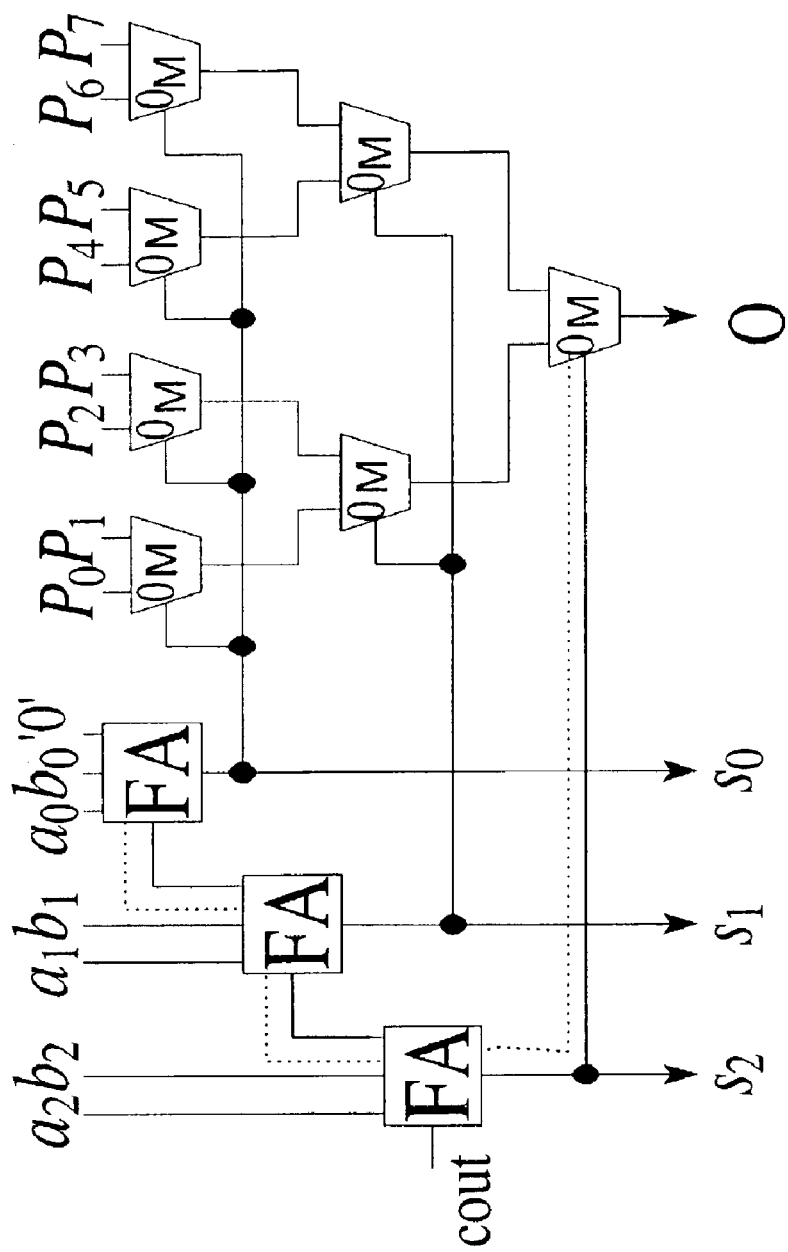
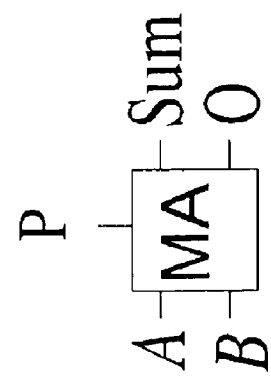
Fig 4b
Fig 4a

US 6,980,138 B2

METHOD AND A SYSTEM FOR VARIABLE-LENGTH DECODING, AND A DEVICE FOR THE LOCALIZATION OF CODEWORDS

CROSS-REFERENCE TO RELATED APPLICATIONS

This application claims priority under 35 USC §119 to Finnish Patent Application No. 20021221 filed on Jun. 20, 2002.

FIELD OF THE INVENTION

The present invention relates to a method for decoding codewords of variable lengths from a bit stream, in which minimum and maximum lengths are determined for the codewords, in which method the bit stream to be decoded is processed in parts, a search for codewords is made in each part of the bit stream, and the found codewords are decoded. The invention also relates to a decoder for decoding of codewords with a variable length from a bit stream, in which minimum and maximum lengths are defined for the codewords, which decoder is provided with means for processing the bit stream to be decoded in parts of a certain length, means for searching for codewords in each part of the bit stream, and means for decoding the codewords found. The invention also relates to a system for the transmission of information in binary format, comprising an encoder and a decoder, and which decoder comprises means for decoding of codewords with a variable length from a bit stream, in which minimum and maximum lengths are defined for the codewords, which decoder is provided with means for processing the bit stream to be decoded in parts of a fixed length, means for searching for codewords in each part of the bit stream, and means for decoding the codewords found. Furthermore, the invention relates to a device comprising a decoder for decoding of codewords with a variable length from a bit stream, in which minimum and maximum lengths are defined for the codewords, which decoder is provided with means for processing the bit stream to be decoded in parts of a fixed length, means for searching for codewords in each part of the bit stream, and means for decoding the codewords found. Finally, the invention relates to a storage means for storing a program comprising steps which can be taken by machine to decode a codeword with a variable length from a bit stream, in which minimum and maximum lengths are defined for the codewords, which program is provided with computer instructions for processing the bit stream to be decoded in parts of a certain length, computer instructions for searching for codewords in each part of the bit stream, and computer instructions for decoding the codewords found.

BACKGROUND OF THE INVENTION

In the transmission of image and video data across data networks, compression of image data is needed, because the quantity of data to be transmitted is extremely large in view of the transmission rates available. Known compression algorithms include lossless as well as lossy algorithms. The discrete cosine transform (DCT) is a lossy algorithm in combination with quantization, to cut redundant information from the image data. The DCT factors are computed for basic image units (for example, 8×8 pixels), and an image block is represented as a matrix consisting of these factors. After the DCT, the factors are arranged by a zig-zag scanning to a suitable order for lossless Huffman coding. The Huffman coding is only an example of a variable length coding (VLC) which reduces the statistical redundancy after the DCT and the quantization. The principle of variable length coding is to present frequently occurring symbols with shorter codewords and less frequently occurring symbols with longer codewords. To begin the coding, the source data is processed by arranging the respective symbols according to the probability of their occurrence. The symbols with the lowest probability are combined recursively into one symbol, wherein a tree structure is formed (example shown in FIG. 1a) to allocate each symbol its own codeword by defining a bit to represent each branch. It can be seen from the code tree of FIG. 1a that the symbol with the lowest probability of occurrence has the longest codeword. Table 1b shows the probability of occurrence P(x), the codeword (code) and the enthropy H(x) for each symbol. The method results in the shortest codeword with the average value, and the compression is very close to the enthropy of the original source; therefore, the coding becomes efficient in general. Consequently, the variable length coding is an essential element in many standards relating to image processing.

As indicated by their definition, the codewords of variable length coding vary in length. If the starting and ending points of the codeword cannot be directly detected from the bit stream, a recursive dependency will develop between the codewords, which makes the decoding more difficult. Due to this dependency, it is necessary that before the variable length decoding (VLD), the codewords must be found from the bit stream, that is, their locations must be determined. In the decoding process, it is thus necessary to determine both the code length and the location, the codeword and the corresponding symbol.

The VLD implementations can be characterized according to the processing of the bit stream in the following way. In bit serial processing, the bit stream is processed bit by bit in series. Thus, the overall incoming bit stream is processed at a constant input rate. As the codewords have variable lengths, the overall decoding of the codeword also takes a variable time, resulting in a variable output rate.

In bit parallel processing, several bits of the incoming bit stream are processed in parallel, either at a constant input rate or at a variable input rate. When the input rate is kept constant, the output rate remains variable, because of the variable length of the codeword. To achieve a constant output rate, variable processing of the incoming bit stream is required. In other words, to secure a constant output rate, the input must contain a number of bits corresponding to the product of the desired output rate and the longest codeword length.

In a way similar to the characterization based on the processing of the bit stream, the parallelism of the decoders can also be described with the number of codewords to be decoded (or symbols obtained from the output) simultaneously. When the decoding is performed with one codeword at a time, the decoding can be characterized as symbol-serial. Correspondingly, when, as as result of the decoding, several symbols are achieved at a time, the decoding is symbol-parallel.

The decoding can be implemented with a tree-based algorithm, which is an implementation opposite to the Huffman tree structure: the encoded incoming bit stream is compared with the binary tree, starting from the root and executing it as long as the whole codeword has been determined from the respective leaf cell. In the decoding of the tree model, efficient decoding is only obtained with short codewords. However, high demands on processing in real time require that a corresponding output rate should also be achieved with long codewords. Furthermore, because of its bit-serial form, the tree model is not suitable for the simultaneous decoding of several symbols, i.e. for symbol-parallel processing, because of the dependency between the codewords when a single bit stream is processed.

The parallelism has been increased by processing several bits in parallel to improve the processing capacity, which is implemented by collecting a sufficient quantity (the maximum codeword length) of data in an input buffer, from whose beginning the codewords are detected and decoded. In symbol-serial decoding, a quantity of data corresponding to the maximum code length is accumulated in the input buffer, to secure that a symbol is found at each cycle. The problem here is that bits are left over at the end of the buffer, which cannot be utilized at the current cycle. Symbol-parallel decoding (or multi-symbol decoding) involves the problem and the challenge for design that the apparatus or system will rapidly become very complex.

C. T. Hsieh and S. P. Kim in "A concurrent memory-efficient VLC decoder for MPEG applications", IEEE Trans. Consumer Electron., vol. 42, no. 3, pp. 439–446, August 1996, present the simultaneous decoding of short codewords in parallel at the same cycle (concurrent decoding algorithm). The decoder utilizes the probability distribution of variable length coding, according to which the bit sequence of the incoming bit stream will, at a higher probability, include more short codewords than long ones. For example, a 16-bit sequence of incoming data may, in the worst case, contain eight 2-bit codewords whose decoding, one symbol at a time, would require eight decoding cycles. The aim of the decoding algorithm disclosed in the publication is to accelerate the decoding process by detecting two or more shorter codewords simultaneously; in other words, the method is used to detect combinations of codewords. For example, in the decoding of a codeword with two levels, the first level of the tree model corresponds to the first codeword to be decoded, and the second level corresponds to the second codeword to be decoded. Thus, the aim is to decode two codewords simultaneously. The length of the first codeword may vary from 2 to k bits. If the length of the first codeword is 2 bits, the length of the second codeword, to be possibly decoded in parallel, is 2 to $k_2$ bits. On the other hand, if the length of the first codeword is 3 bits, the length of the second codeword to be possibly decoded simultaneously is 2 to $k_3$ bits, and so on. As the first level comprises all the codes, k is thus equal to the maximum length of the code book, corresponding to the length of the longest codeword. On the second level, shorter (more probable) codes are preferred according to the basic property of the VLC. Because of this, the value of $k_i$ is in the range $0 \leq k_i \leq k$.

The basic procedure in a two-level decoding process starts from the root of the tree model. The bit sequences of each branch in the tree are tested substantially simultaneously against all the possible codewords on each level. If more than one suitable branch is found on the second level of the tree, that path will be selected which has been continuous from the root on, that is, the bit stream is continuous without breaks. The decoding process may end up on the first level, if none of the branches of the next level gives a continuous path from the root. This means that the second codeword cannot be decoded. The codeword length obtained from each level is used to control the next data of the input stream, wherein the decoding process will start again. The same decoding method can also be used with more levels. A codeword detection block based on the maximum likely bit pattern (MLBP) returns three factors to complete the decoding cycle: group flags to determine the residue in the group, the length to transfer the bit stream to the beginning of the next codeword, and a group code for the memory. The symbol is retrieved from the random access memory according to the residue and the group.

SUMMARY OF THE INVENTION

The aim of the present invention is to make decoding in parallel and in a pipeline possible by eliminating the dependencies between the codewords in the first step of the decoding process, in which the codewords are localized. In the method according to the invention, bit fields of fixed size are extracted from the input buffer, to find all the possible codewords. All the possible codewords are detected from the buffer by means of a cascade structure substantially simultaneously. In other words, from the bit stream coming into the buffer, the codeword lengths are detected from every possible buffer location. However, this will have the result that also invalid codewords are detected from the input buffer. In the method according to the present invention, the valid codeword lengths are selected by means of the preceding codeword lengths in such a way that the result of a first detector (first codeword length) is used to control the selection of the second output. The third codeword length, in turn, is selected on the basis of the sum of the preceding codeword lengths, and so on. In the selection of the actual codewords, multiplexers are used to select the valid codeword length from several codeword lengths (which have been obtained from all the possible codeword locations in the buffer). The multiplexer can be implemented, for example, by using basic logic circuits (AND/OR gates and inverters). In the method according to the invention, the multiplexers are chained in such a way that they give, as their direct output, the lengths of all the complete codewords in the buffer. The data about the partial sum and the sum of the detected codeword lengths is also available for possible use later on. The characteristic of an advantageous embodiment of the invention is to implement the cascade structure, which becomes long, by means of a MultiplexedAdd (MA) device to make the critical path shorter. In the method of the invention, all the integral codewords occurring in the buffer can be detected; therefore, the actual search for symbols can be performed in parallel to accelerate the decoding without limiting dependencies.

To put it more precisely, the method according to the present invention is primarily characterized in that, in the method, at least partly overlapping fields are separated from the part of the bit stream to be processed in such a way that the starting point of at least two fields is a possible starting point for a codeword in said bit stream part, a codeword end is searched from at least one field, and the data related to the codeword is determined on the basis of the end point of the codeword, and data related to at least one codeword is used to determine the occurrence of the codeword to be decoded in the field, and the found codeword is decoded. The decoder according to the invention is primarily characterized in that the decoder also comprises means for extracting at least partly overlapping fields from the bit stream part under processing, in such a way that the starting point of at least two fields is a possible starting point of a codeword in said bit stream part; means for searching for the end of the codeword in at least one field; and means (CD) for determining data related to the codeword found in the field on the basis of the end; and means (MUX1, MUX, M, MA) for determining the occurrence of the codeword to be decoded in the field, on the basis of data related to at least one codeword. The system according to the invention is primarily characterized in that the decoder also comprises means for extracting at least partly overlapping fields from the bit stream part under processing, in such a way that the starting point of at least two fields is a possible starting point of a codeword in said bit stream part; means for searching for the end of the codeword in at least one field; and means for determining data related to the codeword found in the field on the basis of the end point; and means for determining the occurrence of the codeword to be decoded in the field, on the basis of data related to at least one codeword. The device according to the invention is primarily characterized in that the decoder also comprises means for extracting at least partly overlapping fields from the bit stream part under processing, in such a way that the starting point of at least two fields is a possible starting point of a codeword in said bit stream part; means for searching for the end of the codeword in at least one field; and means for determining data related to the codeword found in the field on the basis of the end point; and means for determining the occurrence of the codeword to be decoded in the field, on the basis of data related to at least one codeword. Finally, the storage means according to the invention is primarily characterized in that the program comprises computer instructions for extracting at least partly overlapping fields from the bit stream part under processing, in such a way that the starting point of at least two fields is a possible starting point of a codeword in said bit stream part; computer instructions for searching for the end of the codeword in at least one field; and computer instructions for determining data related to the codeword found in the field on the basis of the end point; and computer instructions for determining the occurrence of the codeword to be decoded in the field, on the basis of data related to at least one codeword.

The present invention improves the prior art for decoding codewords in such a way that it is a bit-parallel, symbol-parallel method, which is also suitable for the decoding of long codewords in parallel. It can thus utilize a longer input buffer (a buffer of any length). Furthermore, the method utilizes the division of decoding into stages for pipelining the implementation. Possible codewords are searched for in all those locations of the input buffer in which the codewords may be located. Valid codewords are detected by indices, which are obtained by computing the sum of the lengths of the preceding suitable codewords. Because data about the limits (starting and end points) is found in connection with finding the codewords, it will be possible to decode codewords independently of other codewords and to increase the parallelism. The output stage of the method according to the invention is proportional to the size of the input buffer.

DESCRIPTION OF THE DRAWINGS

In the following, the present invention will be described in more detail with reference to the drawings, in which FIG. 2 shows a principle of finding VLC codewords from a bit stream according to an advantageous embodiment, FIG. 3 shows, in a reduced chart, a system according to an advantageous embodiment of the invention for finding VLC codewords from a bit stream, FIG. 4a shows a MultiplexedAdd device in a diagram, FIG. 4b shows the internal structure of the MultiplexedAdd.

DETAILED DESCRIPTION OF THE INVENTION

Figures 1A, 1B:
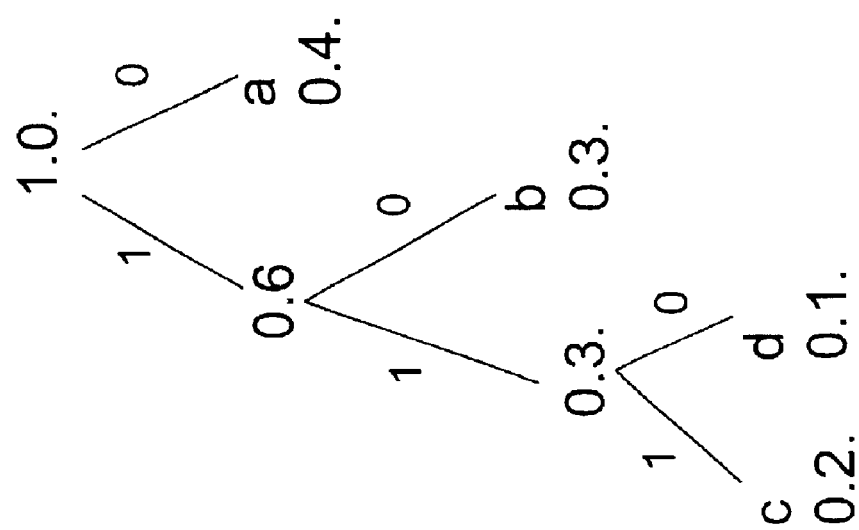
FIG. 1a shows a tree structure formed by Huffman coding.
FIG. 1b shows, in a table format, the Huffman codewords as well as the corresponding symbols and the probabilities of occurrence.

Let us first define how many codewords of variable length may occur in the buffer at a time. For this, the code lengths of the code table are defined by the group $S_L=\{l_1, \ldots, l_n\}$, in which $l_1$ and $l_n$ represent the minimum and maximum lengths of the codeword, respectively. Thus, in a buffer of N bits, the maximum number of codewords is $K_{max}=\lfloor N/l_1 \rfloor$, $N \geq l_n$. Let us indicate variable length codewords with the symbol $W_i$, in which $i=0, 1, \ldots, (K_{max}-1)$ and the length of the codeword $W_i$ with the symbol $L_i$. Also, let us define an index $j_i$, $0 \leq j_i \leq (N-1)$, to represent the first bit of the codeword $W_i$ in a codeword buffer of N bits.

In general, it can be assumed that the first codeword $W_0$ is always located at the beginning of the buffer, wherein the starting point of $W_0$ is $j_0=0$. The second codeword $W_1$ is located right after the first codeword, wherein the index $j_1$ to define the starting point of the second codeword is the length of the first codeword, that is, $j_1=L_0$. This means that the starting point of the codeword $W_i$ is the sum of the lengths of the preceding codewords, that is, $$j_i = \sum_{k=0}^{i-1} L_k.$$

The lengths of the codewords in the buffer are not known in advance. To avoid recursive dependencies, a parallel search will also be needed for codewords at arbitrary locations in the buffer. Generally, all the possible locations of any codeword can be defined by $p=\{l_1, l_1+1, l_1+2, \ldots, N-l_1\}$, which in a buffer of N bits means $N-2(l_1-1)$ locations. Because the maximum length $l_n$ of the codeword is known, fields not larger than the size of the maximum length $l_n$ are separated from all the possible locations defined by p, the possible codeword length being searched in each of them by using, for example, pattern matching, properties of the code table, such as leading characters, maximum likely bit patterns (MLBP) or numerical properties. However, the symbol can only be found if all the bits defining the codeword are available to complete the decoding, i.e. to find the symbol. For this reason, it is easier to detect the codeword in fields which begin from the last $l_n-1$ indices; one only needs to search for codewords with K bits from the bit fields starting from the starting point N-K, in which $K<l_n$.

In the foregoing procedure, redundant codewords are detected, because if a bit field is separated from the middle of a valid longer codeword, a shorter codeword may be found in this codeword. For this reason, each search process only returns the length of a detected codeword. The indices of valid codewords in the buffer can be defined recursively by the lengths; the length of the first codeword defines the starting point for the second codeword; the lengths of the first and second codewords define the starting point for the third codeword, and so on.

FIG. 2 shows an example of finding codewords in a 16-bit buffer by the method according to an advantageous embodiment of the invention. Let us assume a code table in which the lengths are defined by the group $S=\{2, 3, 4, 5, 6, 7, 8\}$ and the maximum number of codewords in a 16-bit input buffer is $K_{max}=8$. According to the above-described method, 14 fields F0–F13 are distinguished from the buffer, an attempt being made to find a possible codeword in each of them. The first field F0 comprises, with certainty, the first suitable codeword W0. The second codeword W1 is found in one of the fields F1–F7. In a corresponding manner, a possible third codeword W2 can be found in one of the fields F3–F13. Possible other codewords W3–W7 can be found in the fields F5–F13. The bit field lengths are shorter in the fields F8–F13 than in the other ones, because the codewords possibly fitting at the end of the buffer are shorter than the maximum length $l_n$.

To complete the decoding process, the symbols corresponding to the codewords are retrieved from the code table. Because the starting and end points of the codewords can be determined by the above-described method, the dependency between the codewords is eliminated. In other words, the codewords can be separated from the input stream, and the search can be carried out independently.

In a summary, the described pattern can be presented as follows:
- the maximum number $K_{max}$ of codewords in a codeword buffer of N bits is determined,
- (N−2($l_1$−1)) fields F0–F(N−2($l_1$−1)−1) of necessary size are separated from the buffer to determine the length of the codeword. The starting point of the fields is the buffer location $\{0, l_1, l_1+1, l_1+2, \ldots, N-l_1\}$.
- the possible codewords are found at the beginning of each field. The length of the found codeword is returned,
- the length of the first codeword is found in the first field, the other valid codewords are found in the buffer by means of indices which are obtained by computing the sum of the lengths of the preceding suitable codewords,
- the symbol corresponding to the suitable codeword is found by means of a code table.

Because both the input and the output levels are variable in the above-described method, buffering will be needed in both the input and the output. FIG. 3 shows a decoder implementing the foregoing procedure, in whose design the simultaneous detection of all the codewords in the input buffer has been taken into account. To implement this, N−2($l_1$−1) codeword detectors CD are used. The first codeword detector CD1 (the left one in FIG. 3) uses the field starting from the beginning of the input buffer to detect a codeword. The second codeword detector CD2 uses the field starting from point $l_1$ of the input buffer to detect a codeword. In the order according to the figure, the N−$l_n$−$l_1$+2 codeword detectors on the left use fields starting from different points of the input buffer (maximum length codewords), whereas the other $l_n$−$l_1$ codeword detectors only need to detect codewords shorter than the maximum length. All the codeword detectors CD1–CD(N−2($l_1$−1)) detect codewords substantially simultaneously and return the length of the found codeword. To select the suitable code lengths $L_i$ from all the codewords found, multiplexers MUX are used which are formed into a cascade structure. Each multiplexer MUX has an input from each codeword detector CD whose location is defined with a group p. The bit fields of the codeword detectors CD are in the locations i$l_1$–i$l_n$ of the input buffer. Because the first code length $L_0$ is always obtained from the first codeword detector CD1, it will control the first multiplexer MUX1 to select the second suitable code length $L_1$. This can also be used to transfer information about the decoding mode. In other words, if the code length is zero, the decoding is either terminated or an error has been found. The other multiplexers are controlled by the sum of the preceding code lengths. In this way, the computation of the sum of the code lengths creates a critical path, which is indicated with a dashed line in FIG. 3.

The codewords can be separated from the input buffer according to the length data and be decoded independently. Furthermore, the decoding can be made parallel, when the dependencies of the codewords have been eliminated.

In a system according to another advantageous embodiment of the invention, a MultiplexedAdd MA is used, whose schematic view is shown in FIG. 4a and internal structure in FIG. 4b. This solution can be used to reduce the critical path developing in the determination of the codeword. As shown in FIG. 4a, the MultiplexedAdd MA computes the sum of two inputs and also performs multiplexing substantially simultaneously. FIG. 4b shows the internal structure of a 3-bit MultiplexedAdd. A MultiplexedAdd of X bits contains X full adders FA and a multiplexing tree structure of X levels, which receive, as their inputs, the sums of the full adders as selection signals as well as alternatives (possibilities, P). An example of the system shown in the figure is two 3-bit numbers A and B whose sum S controls the selection of the output O (corresponding to the codeword length $L_i$ selected from the possibility P) from the possibilities $P_0$–$P_7$ which represent, in the method according to the invention, all the possible codeword lengths for those codewords which begin from the location $\rho_i$ of the input buffer. Thus, the formula for implementing the output can be defined as $$O = P_0 \bar{s}_2 \bar{s}_1 \bar{s}_0 + P_1 \bar{s}_2 \bar{s}_1 s_0$$
$$+ P_2 \bar{s}_2 s_1 \bar{s}_0$$
$$+ P_3 \bar{s}_2 s_1 s_0 +$$
$$P_4 s_2 \bar{s}_1 \bar{s}_0 +$$
$$P_5 s_2 \bar{s}_1 s_0 + P_6 s_2 s_1 \bar{s}_0 + P_7 s_2 s_1 s_0$$

which can further be reduced to the form:

$$\begin{aligned} O &= (P_0 \bar{s}_1 \bar{s}_0 + P_1 \bar{s}_1 s_0 + P_2 s_1 \bar{s}_0 + P_3 s_1 s_0) \bar{s}_2 + \\ &\quad (P_4 \bar{s}_1 \bar{s}_0 + P_5 \bar{s}_1 s_0 + P_6 s_1 \bar{s}_0 + P_7 s_1 s_0) s_2 \\ &= [(P_0 \bar{s}_0 + P_1 s_0) \bar{s}_1 + (P_2 \bar{s}_0 + P_3 s_0) s_1] \bar{s}_2 + \\ &\quad [(P_4 \bar{s}_0 + P_5 s_0) \bar{s}_1 + (P_6 \bar{s}_0 + P_7 s_0) s_1] s_2 \end{aligned}$$

Figure 5:
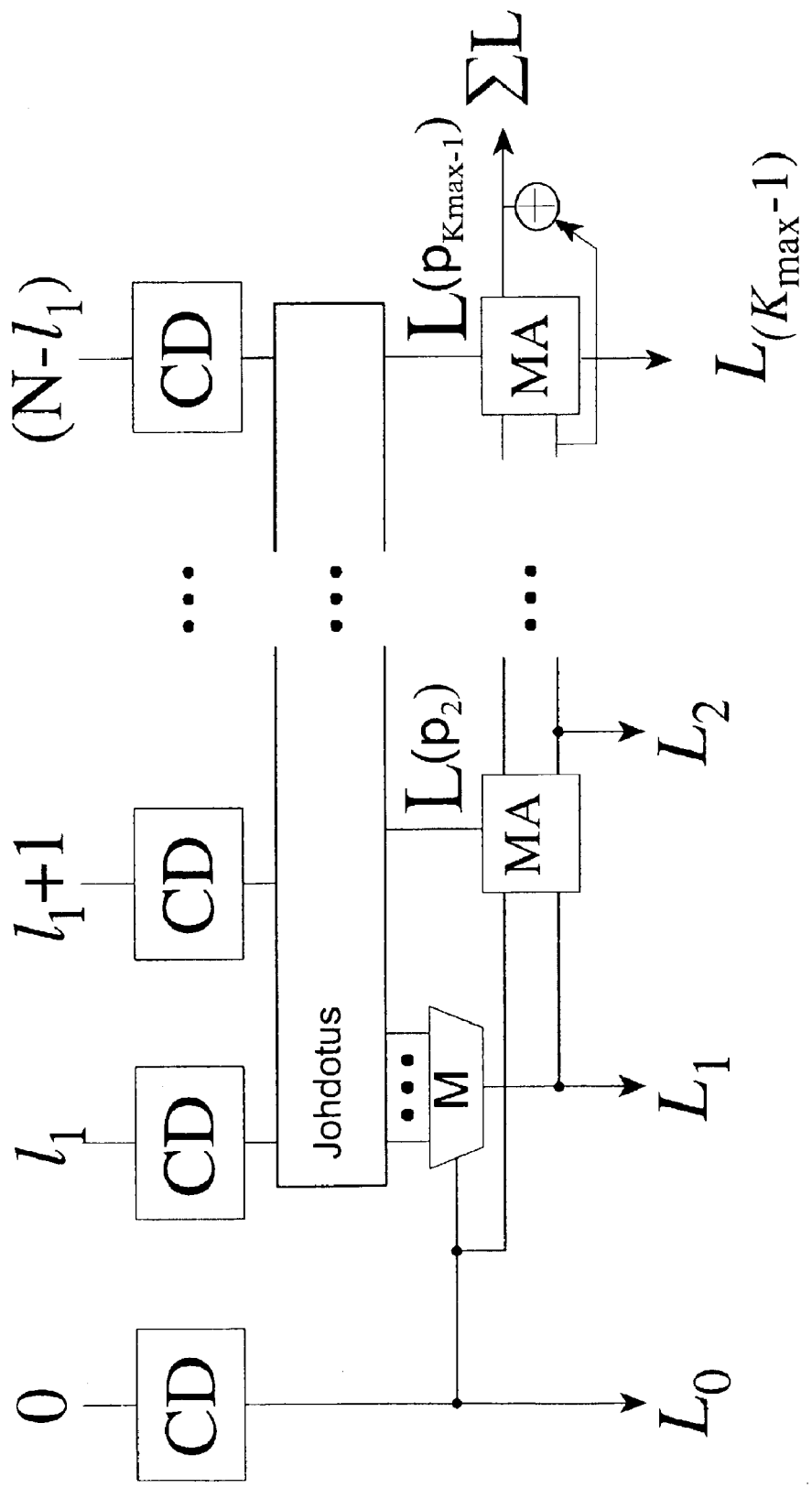
FIG. 5 shows, in a reduced chart, a system according to another advantageous embodiment of the invention for finding VLC codewords form a bit stream, by using the MultiplexedAdd.

By means of the MultiplexedAdd MA, it is possible to compute the sums of the present code length $L_i$ and the preceding code lengths $$\sum_{k=0}^{i-1} L_k$$

and to select the next code length $L_{i+1}$. By using the MultiplexedAdd MA, the delay between two code lengths is reduced from the delay of the log(N) bit adder and the multiplexer group to the delay of the log(N) full adder and the 2-1 multiplexer. In a corresponding manner, the logical stages are reduced from the 2log(N) stages to the log(N)+1 stages by using 3-4 AND-OR gates and 2-2 AND-OR gates and inverters. FIG. 5 shows a system for finding codewords by means of a MultiplexedAdd MA according to a second advantageous embodiment of the invention.

The decoder for variable length coding according to the invention can be implemented as a part of an electronic device, for example as separate logic circuits, by means of an application specific integrated circuit (ASIC) in a digital signal processor, or as a functional unit in a processor. Typically, the electronic device also comprises other functions, such as means for displaying decoded information to the user and a processor for controlling the electronic device.

It will be obvious that the present invention is not limited solely to the above-presented embodiment, but it can be modified within the scope of the appended claims.

What is claimed is:

1. A method for decoding codewords of variable length from a bit stream, in which minimum and maximum lengths are defined for the codewords, in which method the bit stream to be decoded is processed in parts, each part of the bit stream is subjected to a search for codewords, and found codewords are decoded, wherein in the method, at least partly overlapping fields are extracted from the part of the bit stream to be processed in such a way that the starting point of at least two fields is a possible starting point for a codeword in said bit stream part, a codeword end is searched from at least one field, and data related to the codeword is determined on the basis of the end point of the codeword, and the data related to at least one codeword is used to determine the occurrence of the codeword to be decoded in the field, and the found codeword is decoded.

2. The method according to claim 1, wherein the data related to the codeword to be decoded comprises the length of the codeword to be decoded, wherein the search for codewords to be decoded is performed in the following way:

the first codeword to be decoded is searched for in the first field, the next codeword to be decoded is searched for in a field whose starting point is the point corresponding to the sum of the lengths of the preceding codewords to be decoded, in the bit stream part under processing, the foregoing step is taken to find all the codewords to be decoded in the bit stream part under processing.

3. The method according to claim 2, wherein in the method, to determine the starting point of the next codeword to be decoded, the sum of the lengths of the preceding found codewords to be decoded is computed and the starting point is selected substantially simultaneously.

4. The method according to claim 3, wherein in finding codewords from the bit stream part under processing, the following formula is used:

$$O = P_0 \bar{s}_2 \bar{s}_1$$

$$\bar{s}_0 + P_1 s + ee\ _2\text{fheight} \bar{s}_1 s_0 + P_2 \bar{s}_2 s_1 + e, \text{ovs}\ s$$

$$_0 + P_3 \bar{s}_2 s_1 s_0 +$$

$$P_4 s_2 \bar{s}_1 s_0 +$$

$$P_5 s_2 \bar{s}_1 s_0 + P_6$$

$$s_2 s_1 \bar{s}_0 + P_7 s_2$$

$$s_1 s_0$$

in which $s_n$, $s_1$, $s_0$ are bits of the sum of the lengths of found codewords to be decoded preceding the field under examination, $P_0 - P_{ln}$ represent all the possible codeword lengths for those codewords which begin from the location $p_i$ in the bit stream part under processing, and O is the selection of the end of the codeword to be searched in the different alternatives.

5. The method according to the claim 1, wherein at least the first, the second and the third found codewords are decoded.

6. A decoder for decoding codewords of varying length from a bit stream, in which minimum and maximum lengths are defined for the codewords, which decoder is provided with means for processing the bit stream to be decoded in parts of a fixed length, means for searching for codewords in each part of the bit stream, and means for decoding the codewords found, wherein the decoder also comprises means for extracting at least partly overlapping fields from the bit stream part under processing, in such a way that the starting point of at least two fields is a possible starting point of a codeword in said bit stream part; means for searching for the end of the codeword in at least one field; and means for determining data related to the codeword found in the field on the basis of the end; and means for determining the occurrence of the codeword to be decoded in the field, on the basis of the data related to at least one codeword.

7. The decoder according to claim 6, wherein the data related to the codeword to be decoded comprises the length of the codeword to be decoded, and that the decoder comprises means for searching for the first codeword to be decoded in the first field, searching means for searching for the next codeword to be decoded in the fields, wherein said means are arranged to form the length data of the codeword found in the field, selection means for selecting codewords to be decoded from the bit stream part under processing, at locations whose starting point is the sum of the lengths of the preceding codewords to be decoded.

8. A system for transmitting information in binary format, comprising an encoder and a decoder, and which decoder comprises means for decoding codewords with a variable length from a bit stream, in which minimum and maximum lengths are defined for the codewords, which decoder is provided with means for processing the bit stream to be decoded in parts of a fixed length, means for searching for codewords in each part of the bit stream, and means for decoding the codewords found, wherein the decoder also comprises means for extracting at least partly overlapping fields from the bit stream part under processing, in such a way that the starting point of at least two fields is a possible starting point of a codeword in said bit stream part; means for searching for the end of the codeword in at least one field; and means for determining data related to the codeword found in the field on the basis of the end point; and means for determining the occurrence of the codeword to be decoded in the field, on the basis of the data related to at least one codeword.

9. The system according to claim 8, wherein the data related to the codeword to be decoded comprises the length of the codeword to be decoded, and that the decoder comprises means for searching for the first codeword to be decoded in the first field, searching means for searching for the next codeword to be decoded in the fields, wherein said means are arranged to form the length data of the codeword found in the field, selection means for selecting codewords to be decoded from the bit stream part under processing, at locations whose starting point is the sum of the lengths of the preceding codewords to be decoded.

10. A device comprising a decoder for decoding codewords with a variable length from a bit stream, in which minimum and maximum lengths are defined for the codewords, which decoder is provided with means for processing the bit stream to be decoded in parts of a fixed length, means for searching for codewords in each part of the bit stream, and means for decoding the codewords found, wherein the decoder also comprises means for extracting at least partly overlapping fields from the bit stream part under processing, in such a way that the starting point of at least two fields is a possible starting point of a codeword in said bit stream part; means for searching for the end of the codeword in at least one field; and means for determining data related to the codeword found in the field on the basis of the end point; and means for determining the occurrence of the codeword to be decoded in the field, on the basis of the data related to at least one codeword.

11. The device according to claim 10, wherein the data related to the codeword to be decoded comprises the length of the codeword to be decoded, and that the decoder comprises means for searching for the first codeword to be decoded in the first field, searching means for searching for the next codeword to be decoded in the fields, wherein said means are arranged to form the length data of the codeword found in the field, selection means for selecting codewords to be decoded from the bit stream part under processing, at locations whose starting point is the sum of the lengths of the preceding codewords to be decoded.

12. The device according to claim 10, wherein the device comprises means for summing up the lengths of the codewords to be decoded, to determine the starting points of the codewords to be decoded and for selecting the starting point substantially simultaneously.

13. A device according to claim 10, wherein it comprises means for performing mobile communication.

14. A storage means for storing a program, comprising computer-readable instructions which can be executed by a computer to decode a codeword with a variable length from a bit stream, in which minimum and maximum lengths are defined for the codewords, which program is provided with computer instructions for processing the bit stream to be decoded in parts of a fixed length, computer instructions for searching for codewords in each part of the bit stream, and computer instructions for decoding the codewords found, wherein the program comprises computer instructions for extracting at least partly overlapping fields from the bit stream part under processing, in such a way that the starting point of at least two fields is a possible starting point of a codeword in said bit stream part; computer instructions for searching for the end of the codeword in at least one field; and computer instructions for determining data related to the codeword found in the field on the basis of the end point; and computer instructions for determining the occurrence of the codeword to be decoded in the field, on the basis of the data related to at least one codeword.

* * * * *

UNITED STATES PATENT AND TRADEMARK OFFICE
CERTIFICATE OF CORRECTION

PATENT NO. : 6,980,138 B2  
DATED : December 27, 2005  
INVENTOR(S) : Vassiliadis et al.

It is certified that error appears in the above-identified patent and that said Letters Patent is hereby corrected as shown below:

<u>Column 9,</u>
Lines 50-60, delete current formula and insert the following formula:

$$O = P_0 \bar{s}_n \ldots \bar{s}_1 \bar{s}_0 + P_1 \bar{s}_n \ldots \bar{s}_1 s_0 + P_2 \bar{s}_n \ldots s_1 \bar{s}_0 + P_3 \bar{s}_n \ldots s_1 s_0 + \ldots + P_{ln} s_n \ldots s_1 s_0,$$

Signed and Sealed this

Twenty-eighth Day of March, 2006

JON W. DUDAS  
*Director of the United States Patent and Trademark Office*